(12) United States Patent
Hargan

(10) Patent No.: US 8,418,014 B2
(45) Date of Patent: *Apr. 9, 2013

(54) MULTIPLE DEVICE APPARATUS, SYSTEMS, AND METHODS

(75) Inventor: Ebrahim H Hargan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/355,197

(22) Filed: Jan. 20, 2012

(65) Prior Publication Data

US 2012/0124445 A1 May 17, 2012

Related U.S. Application Data

(63) Continuation of application No. 12/185,704, filed on Aug. 4, 2008, now Pat. No. 8,103,928.

(51) Int. Cl.
*G06F 11/00* (2006.01)
(52) U.S. Cl.
USPC .......................................... 714/746; 714/763
(58) Field of Classification Search .................. None
See application file for complete search history.

(56) References Cited

U.S. PATENT DOCUMENTS

| 7,328,381 | B2 | 2/2008 | Jeddeloh et al. | |
|---|---|---|---|---|
| 8,103,928 | B2 | 1/2012 | Hargan | |
| 2005/0154960 | A1* | 7/2005 | Sydir et al. | 714/758 |
| 2006/0242493 | A1* | 10/2006 | Milliken | 714/718 |
| 2007/0150792 | A1* | 6/2007 | Ruckerbauer | 714/763 |
| 2008/0092020 | A1* | 4/2008 | Hasenplaugh et al. | 714/781 |
| 2008/0244358 | A1* | 10/2008 | Nygren | 714/755 |
| 2009/0006921 | A1* | 1/2009 | Engberg | 714/752 |
| 2009/0019337 | A1* | 1/2009 | Pi et al. | 714/758 |
| 2009/0019342 | A1* | 1/2009 | Gueron et al. | 714/781 |
| 2009/0077456 | A1* | 3/2009 | Pi et al. | 714/807 |
| 2009/0187794 | A1* | 7/2009 | Kim et al. | 714/43 |
| 2010/0031129 | A1 | 2/2010 | Hargan | |
| 2010/0070830 | A1* | 3/2010 | Ngo | 714/763 |
| 2010/0262889 | A1* | 10/2010 | Bains | 714/758 |
| 2010/0287441 | A1* | 11/2010 | Seo et al. | 714/755 |
| 2010/0293436 | A1* | 11/2010 | Coteus et al. | 714/763 |

* cited by examiner

*Primary Examiner* — Yolanda L Wilson
(74) *Attorney, Agent, or Firm* — Schwegman, Lundberg & Woessner, P.A.

(57) ABSTRACT

Data digits and correction digits are received in each of a number of integrated circuit (IC) devices. Apparatus, systems, and methods are disclosed that operate to check the data digits for error in each IC device according to an algorithm associated with the IC device, the algorithm being different for each IC device. Each IC device will act in response to the data digits if no error is detected in the data digits. Additional apparatus, systems, and methods are disclosed.

25 Claims, 6 Drawing Sheets

MULTIPLE DEVICE APPARATUS, SYSTEMS, AND METHODS

PRIORITY APPLICATION

This application is a continuation of U.S. application Ser. No. 12/185,704, filed Aug. 4, 2008, now U.S. Pat. No. 8,103,928 which is incorporated herein by reference in its entirety.

BACKGROUND

Integrated circuit (IC) devices, including memory devices, are often used in computers and other electronic products (e.g., digital televisions, digital cameras, and cellular phones) to store data and other information. Multiple IC devices are often used together in a system.

DETAILED DESCRIPTION

Figure 1:
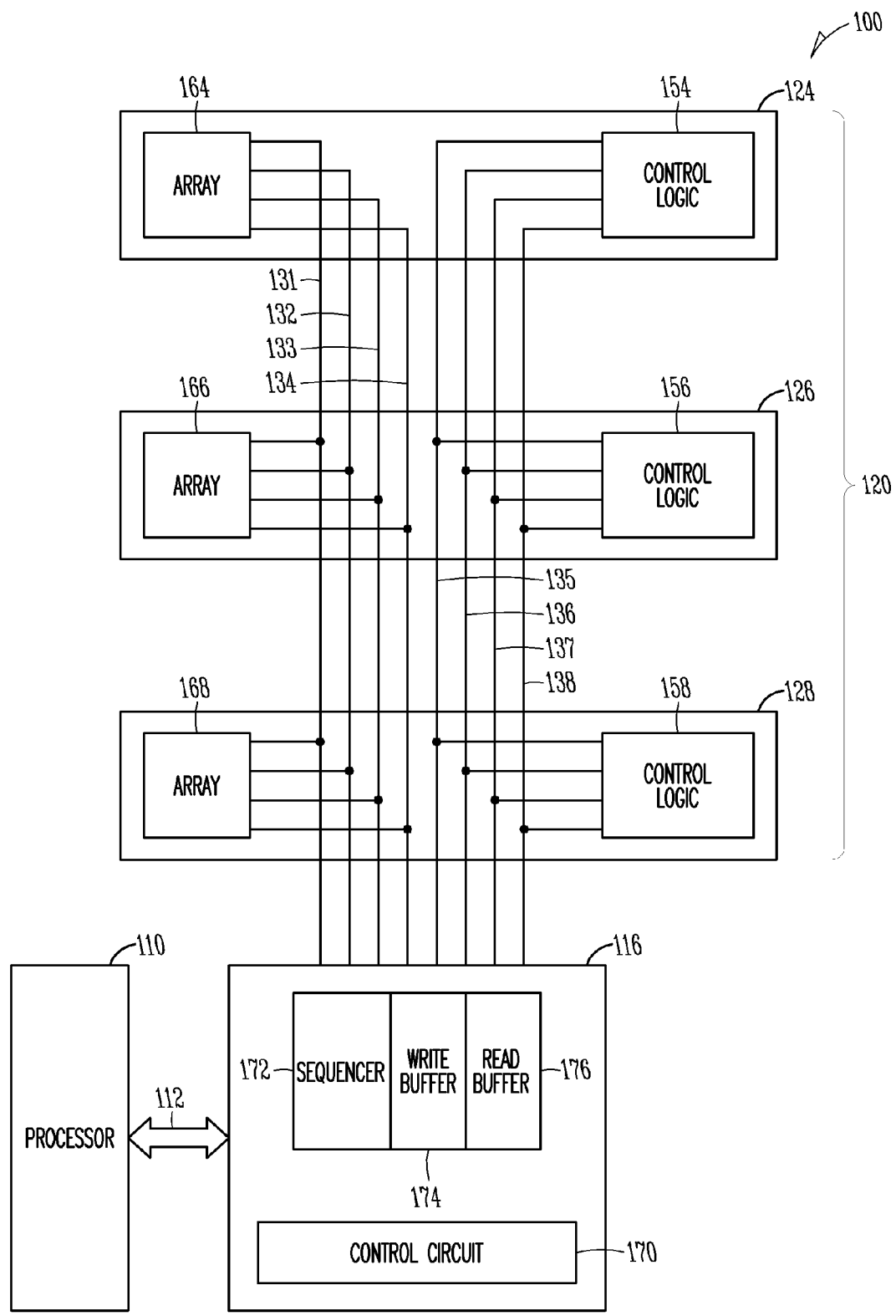
FIG. 1 is a block diagram of a system according to various embodiments of the invention.

Systems including multiple devices typically receive information in the form of data digits. Some of the data digits, called chip select digits, select the device that is to receive and act on the information. The chip select digits take up bandwidth and may be communicated on dedicated channels between the devices. If the data digits are transmitted in packets, the chip select digits may result in the packet having a non-binary length. In addition, read data packets do not include chip select digits, while write data packets do include chip select digits.

The inventor has discovered that the challenges noted above, as well as others, can be addressed by encoding correction digits differently depending on the device being addressed. Encoding correction digits to select a device to receive and act on the data digits transmitted as well as to provide a capability to detect and correct errors in the data digits makes it unnecessary to send separate chip select digits. This reduces the bandwidth used to transmit information to multiple devices and may reduce the number of channels over which the information is transmitted.

In this description, an algorithm is a sequence of computational acts that transform an input value, or set of values, to produce an output value, or set of values.

In this description, a data digit is an item of data that has one of two or more values. A binary data digit, also called a data bit, has one of two values, a logical one (1) or a logical zero (0). A non-binary data digit has one of three or more values. The following description refers to data digits, and embodiments of the invention described herein may be implemented with data digits or data bits.

A cyclic redundancy check (CRC) is an algorithm used to identify and correct errors in a group of data digits before they are used for their intended purpose. A computation of a CRC resembles a long division of data digits by a divisor, called a CRC polynomial, to produce a CRC remainder of data digits. An example of a CRC polynomial is:

$$x^8+x^7+x^3+x^2+1$$

The length of the CRC remainder is less than the length of the polynomial. When a CRC remainder is computed from a group of data digits to be transmitted, the CRC remainder is tacked onto the end of the data digits before transmission. The CRC remainder is used by a receiving device to identify and correct errors in the data digits. Different CRC polynomials constitute different algorithms according to various embodiments of the invention.

An error correcting code (ECC) is an algorithm used to identify and correct errors in a group of data digits before they are used for their intended purpose. Examples of ECC algorithms include, but are not limited to, a Hamming code, a Reed-Solomon code, a Bose Chaudhuri Hocquenghem (BCH) code, a binary Golay code, a ternary Golay code, a Reed-Muller code, a turbo code, and a low-density parity-check (LDPC) code. ECC digits can be calculated for data digits according to one of the above-listed codes, and are transmitted with the data digits and used by a receiving device to identify and correct errors in the data digits. Each of the above-listed codes is a different algorithm according to various embodiments of the invention.

FIG. 1 is a block diagram of a system 100 according to various embodiments of the invention. The system 100 includes a processor 110 coupled through a bus 112 to an interface device 116 and a stack 120. The stack 120 includes IC dies and channels according to various embodiments of the invention. A stack of IC dies includes a collection of IC dies coupled together to exchange data, address, and control signals. The stack 120 includes several separate IC dies 124, 126, 128, coupled to a number of channels 131, 132, 133, 134, 135, 136, 137, and 138 to transfer information. The stack 120 may include more channels. Each of the channels 131-138 may be an electrically conductive path such as a through silicon via. The interface device 116 may be an IC in a separate IC die coupled to the stack 120 through the channels 131-138.

Each of the IC dies 124, 126, and 128 may be a memory device formed of semiconductor material and includes electronic circuitry which includes respective control logic circuits 154, 156, and 158 and respective arrays 164, 166, and 168 of memory cells. The IC dies 124, 126, and 128 may communicate with each other through the channels 131-138 and with the processor 110 through the interface device 116. Other devices such as other memory devices or processors may be coupled to the interface device 116 to communicate with the IC dies 124, 126, and 128. The channels 131-138 extend through or into the IC dies 124, 126, and 128 in the stack 120. The IC dies 124, 126, and 128 may have a different order, arrangement, or orientation with respect to each other in the stack 120 according to various embodiments of the invention. The stack 120 may include more or fewer IC dies according to various embodiments of the invention.

Information exchanged between the processor 110 and the stack 120 may be controlled by a control circuit 170 in the interface device 116. The information includes one or more of data, address, and control information or other information. The control circuit 170 may control information exchanged between the processor 110 and any other device coupled to the interface device 116. Information exchanged on the channels 131-138 between the interface device 116 and the IC dies 124, 126, and 128 may be controlled by a sequencer 172. A write buffer 174 in the interface device 116 stores information to be transmitted on the channels 131-138, and information received from the channels 131-138 is stored in a read buffer 176 in the interface device 116.

The channels 131-138 may be arranged into different buses to transfer different types of information. For example, the channels 131-134 may form a data bus to transfer information representing data to be stored in or read from the arrays 164, 166, and 168. The channels 135 and 136 may form an address bus to transfer information representing an address of a location where data may be stored in the arrays 164, 166, and 168. The channels 137 and 138 may form a control bus to transfer control information to the control logic circuits 154, 156, and 158 to control operations of the stack 120. Other channels (not shown) may form a power bus to provide power to the IC dies 124, 126, and 128.

The stack 120 shown in FIG. 1 includes a specific number of channels as an example. The number of channels in the stack 120 may vary. For example, the stack 120 may include tens, hundreds, or thousands of channels extending through or into the IC dies 124, 126, and 128 in the stack 120.

According to various embodiments, the stack 120 shown in FIG. 1 may include only a single memory device or processor such that parts of the single memory device or processor may be distributed among the IC dies 124, 126, and 128. The stack 120 may also include multiple memory devices or processors where each of the IC dies 124, 126, and 128, by itself, includes a separate memory device or processor. The IC dies 124, 126, and 128 may be all memory devices or all processors or an assortment of memory devices and processors. The IC dies 124, 126, and 128 may have a different order, arrangement, or orientation with respect to each other in the stack 120 according to various embodiments of the invention. The IC dies 124, 126, and 128 may include memory devices such as Flash memory devices, dynamic random access memories (DRAMs), or synchronous DRAMs (SDRAMs). The IC dies 124, 126, and 128 may be of the same design or may be of different designs.

Figure 2A:
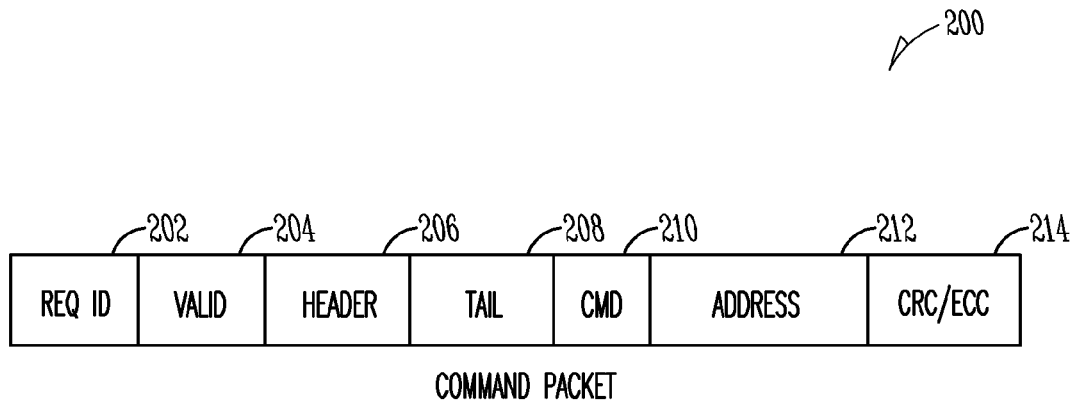
FIG. 2A illustrates a data structure of a command packet used in the system shown in FIG. 1, according to various embodiments of the invention.

Information may be transmitted in packets between the interface device 116 and the IC dies 124, 126, and 128. FIG. 2A illustrates a data structure 200 of a command packet used in the system 100 shown in FIG. 1, according to various embodiments of the invention. In various embodiments, the data structure 200 contains multiple fields of digits including request identification (ID) digits 202, valid indicator digits 204, header digits 206, tail digits 208, command (CMD) digits 210, address digits 212, and correction digits 214. The correction digits may be CRC digits or ECC digits. In various embodiments, the request ID digits 202 are used to identify the address of the sender sending the CMD digits 210. In various embodiments, the request ID digits 202 are used to re-order information that is returned to the sender. In various embodiments, valid indicator digits 204 are used to indicate the validity of the information being transferred. In various embodiments, the header digits 206 are used to identify the start of a data block transfer and the tail digits 208 are used to identify an end of the data block transfer. In various embodiments, the CMD digits 210 are used to read, write or configure a memory device such as one or more of the IC dies 124, 126, and 128 shown in FIG. 1. In various embodiments, the address digits 212 contain Y, Z address information for routing data to memory locations within the IC dies 124, 126, and 128. A "Y" would indicate an address of a sending entity and a "Z" would indicate an address of a receiving entity. In various embodiments, the correction digits are used to identify and correct errors in the other digits in the data structure 200.

Figure 2B:
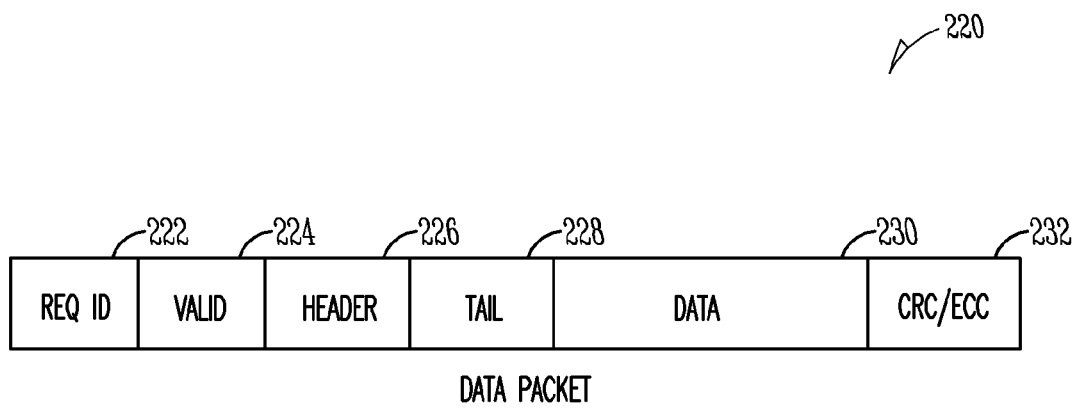
FIG. 2B illustrates a data structure of a data packet used in the system shown in FIG. 1, according to various embodiments of the invention.

FIG. 2B illustrates a data structure 220 of a data packet used in the system 100 shown in FIG. 1, according to various embodiments of the invention. In various embodiments, the data structure 220 contains multiple fields of digits including request ID digits 222, valid indicator digits 224, header digits 226, tail digits 228, data digits 230 and correction digits 232. The correction digits 232 may be CRC digits or ECC digits. In various embodiments, the request ID digits 222 are used to identify an address of a sender sending the data digits 230. In various embodiments, valid indicator digits 224 are used to indicate the validity of the data digits 230 being transferred. In various embodiments, the header digits 226 are used to identify the start of a data block transfer and the tail digits 228 are used to identify the end of the data block transfer. In various embodiments, the data width represented by data digits field 230 can be programmable to any of 32, 64, or 128 digits. In various embodiments, the correction digits are used to identify and correct errors in the other digits in the data structure 220.

The command packet or the data packet may be received by multiple pins in each of the IC dies 124, 126, and 128 shown in FIG. 1.

Figure 3:
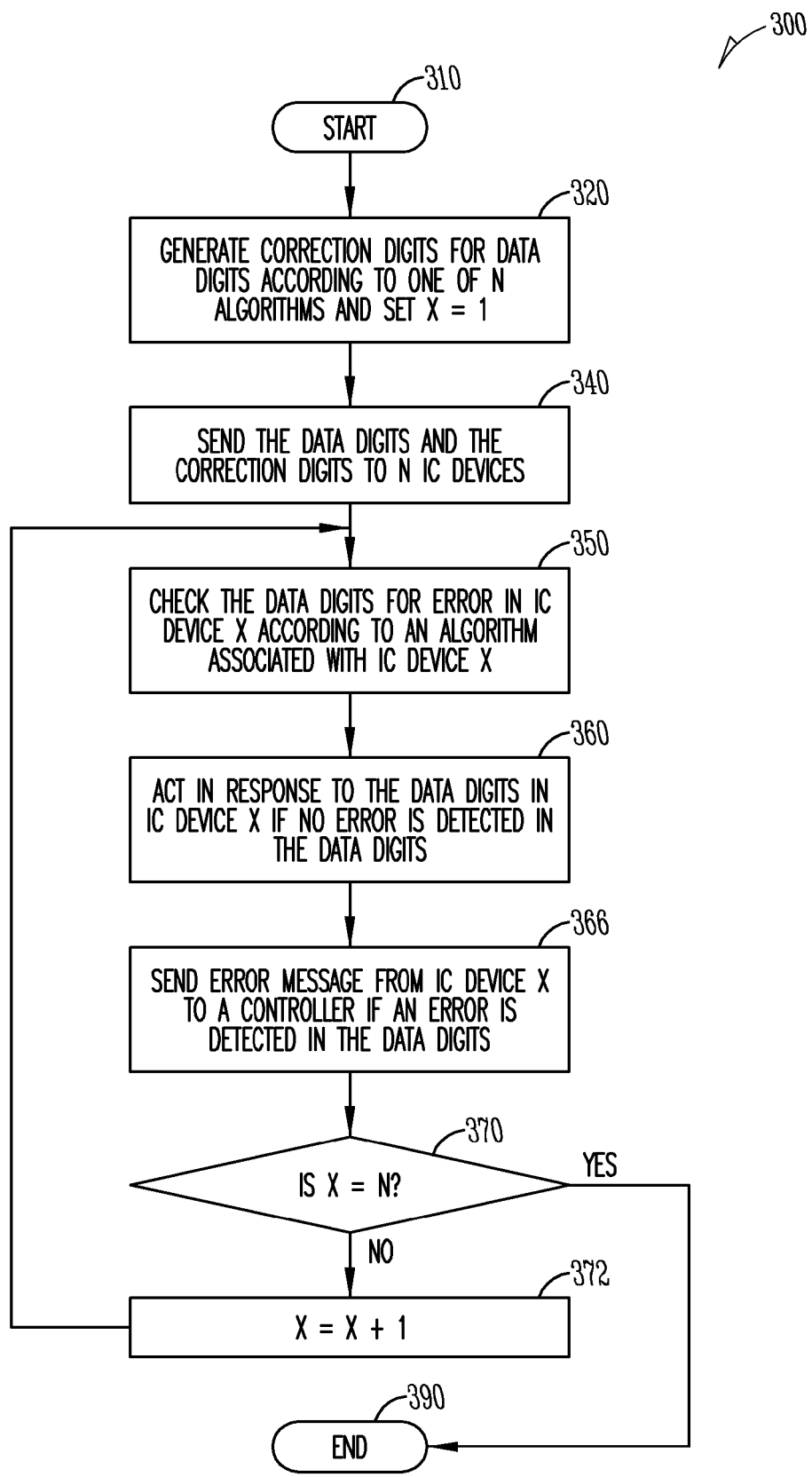
FIG. 3 is a flow diagram of a method according to various embodiments of the invention.

FIG. 3 is a flow diagram of a method 300 according to various embodiments of the invention. The method 300 starts in block 310. In block 320, correction digits are generated for data digits according to one of N algorithms where N is an integer. N refers to the number of algorithms and a number of IC devices in a system operated according to the method 300. Different algorithms can be different ECCs or CRCs with different polynomials or different ways of modifying the CRC remainder as discussed below. Also in block 320, a counter X is set equal to 1 where X is an integer. The counter X identifies one of the N IC devices. In block 340, the data digits and the correction digits are sent to the N IC devices. In block 350, the data digits are checked for error in IC device X according to an algorithm associated with the IC device X. In block 360, IC device X acts in response to the data digits if no error is detected in the data digits. In block 366, IC device X sends an error message to a controller if an error is detected in the data digits. The controller may be the interface device 116 shown in FIG. 1. In block 370, a determination is made as to whether X equals N. If X does not equal N in block 370, X is increased by 1 in block 372 and the method 300 returns to block 350. If X equals N in block 370, the method 300 ends in block 390.

According to various embodiments, the correction digits used in the method 300 are CRC digits that are calculated differently for each of the N IC devices. A different polynomial is assigned to each of the N IC devices, and each IC device uses its own polynomial to check for error in the data digits. The controller chooses which IC device is to be the intended recipient of the data digits, called a selected IC device, and calculates CRC digits by dividing the data digits by the polynomial assigned to the selected IC device. The data digits and the CRC digits are transmitted to all N of the IC devices, and each IC device divides the data digits by its own assigned polynomial to generate its own CRC digits. Each IC device compares its own CRC digits with the CRC digits received from the controller, and only one of the IC devices is able to calculate its own CRC digits to be the same as the CRC digits received from the controller and detect no error in the data digits. The IC device detecting no error in the data digits will act in response to the data digits. Other IC devices will divide the data digits by their own polynomial, different from the polynomial used by the controller, to generate their own CRC digits that are different from the CRC digits received from the controller. These IC devices will identify an error in the data digits and send an error message to the controller to request that the data digits be retransmitted. The controller will decide that the data digits contain an error only when all N of the IC devices return an error message.

According to various embodiments, CRC digits used in the method 300 may be calculated in a different manner. CRC digits may be calculated by dividing the data digits by a polynomial and then modifying the CRC digits differently depending on the IC device that is the intended recipient of the data digits. According to various embodiments, a different quantity is added to the CRC digits for each of the N IC devices, and each IC device adds its own quantity to the CRC digits before checking the data digits for error using the modified CRC digits. The quantity may be an integer. The controller chooses which IC device is to be the intended recipient of the data digits, called a selected IC device, and adds a quantity to the CRC digits, the quantity being assigned to the selected IC device. The data digits and the CRC digits are transmitted to all N of the IC devices, and each IC device divides the data digits by the polynomial to generate a CRC remainder, and then adds its own quantity to the CRC remainder to generate its own CRC digits. Each IC device compares its own CRC digits with the CRC digits received from the controller, and only one of the IC devices is able to calculate its own CRC digits to be the same as the CRC digits received from the controller and detect no error in the data digits. The IC device detecting no error in the data digits will act in response to the data digits. Other IC devices will add a quantity to the CRC remainder different from the quantity used by the intended recipient to generate their own CRC digits that are different from the CRC digits received from the controller. These IC devices will identify an error in the data digits and send an error message to the controller to request that the data digits be retransmitted. The controller will decide that the data digits contain an error only when all N of the IC devices return an error message.

Figure 4:
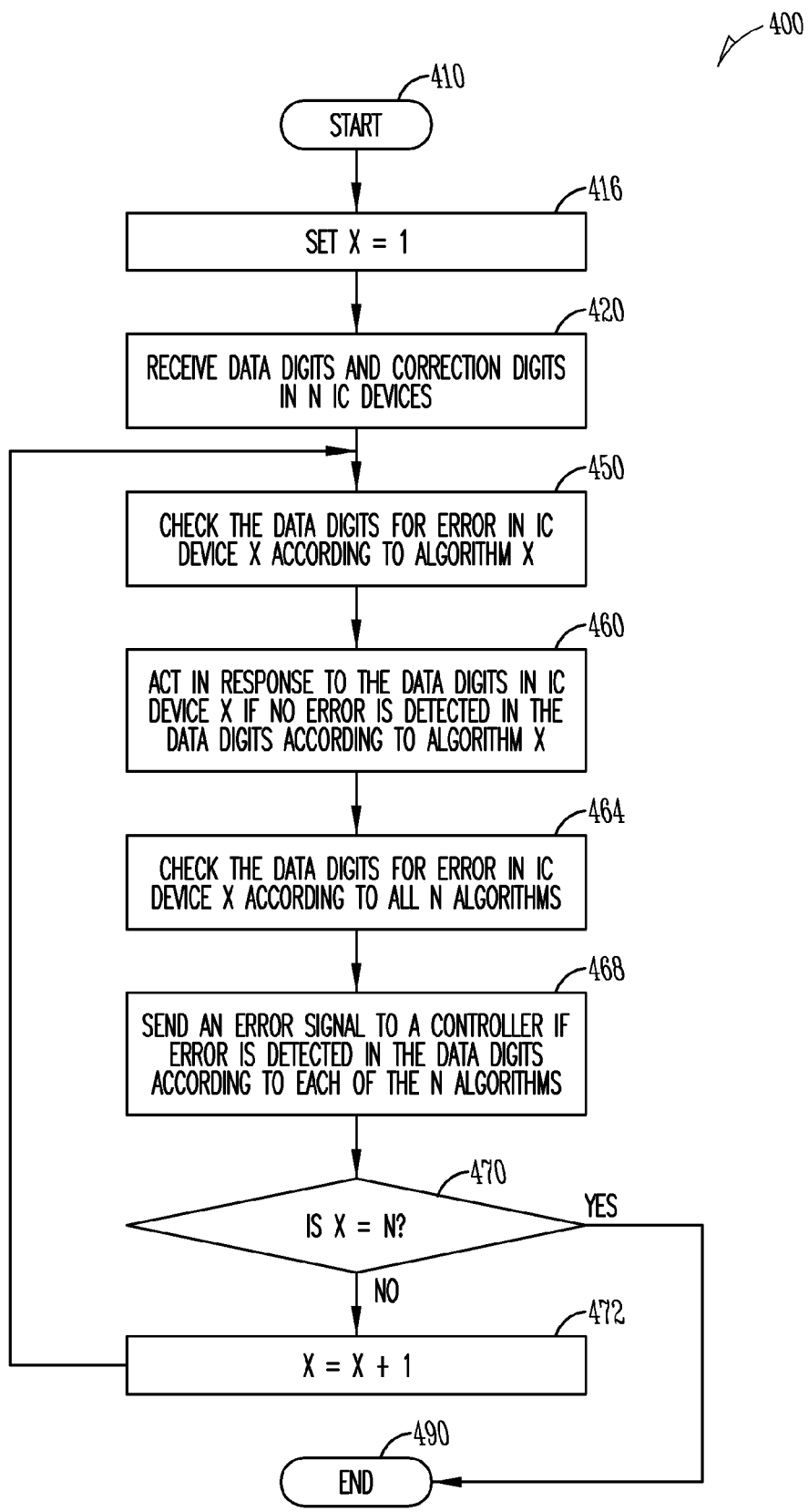
FIG. 4 is a flow diagram of a method according to various embodiments of the invention.

FIG. 4 is a flow diagram of a method 400 according to various embodiments of the invention. The method 400 starts in block 410. In block 416, a counter X is set equal to 1 where X is always an integer. The counter X identifies one of N IC devices where N is an integer. N refers to the number of IC devices and a number of algorithms used in a system operated according to the method 400. In block 420, data digits and correction digits are received in the N IC devices. In block 450, the data digits are checked for error in IC device X according to an algorithm associated with the IC device X. Different algorithms can be different ECCs or CRCs with different polynomials or different ways of modifying the CRC remainder as discussed below. In block 460, IC device X acts in response to the data digits if no error is detected in the data digits according to the algorithm associated with the ID device X. In block 464, the data digits are checked for error in the IC device X according to N algorithms associated with all N of the IC devices. If an error is detected in the data digits according to each of the algorithms associated with the N IC devices, an error message is sent by the IC device X to the controller in block 468. In block 470, a determination is made as to whether X equals N. If X does not equal N in block 470, X is increased by 1 in block 472 and the method 400 returns to block 450. If X equals N in block 470, the method 400 ends in block 490.

The individual activities of the methods 300 and 400 do not have to be performed in the order shown or in any particular order. Some of the activities may be repeated and others may occur only once. Some of the activities may be performed in parallel. Various embodiments may have more or fewer activities than those shown in FIG. 3 and FIG. 4.

Figure 5:
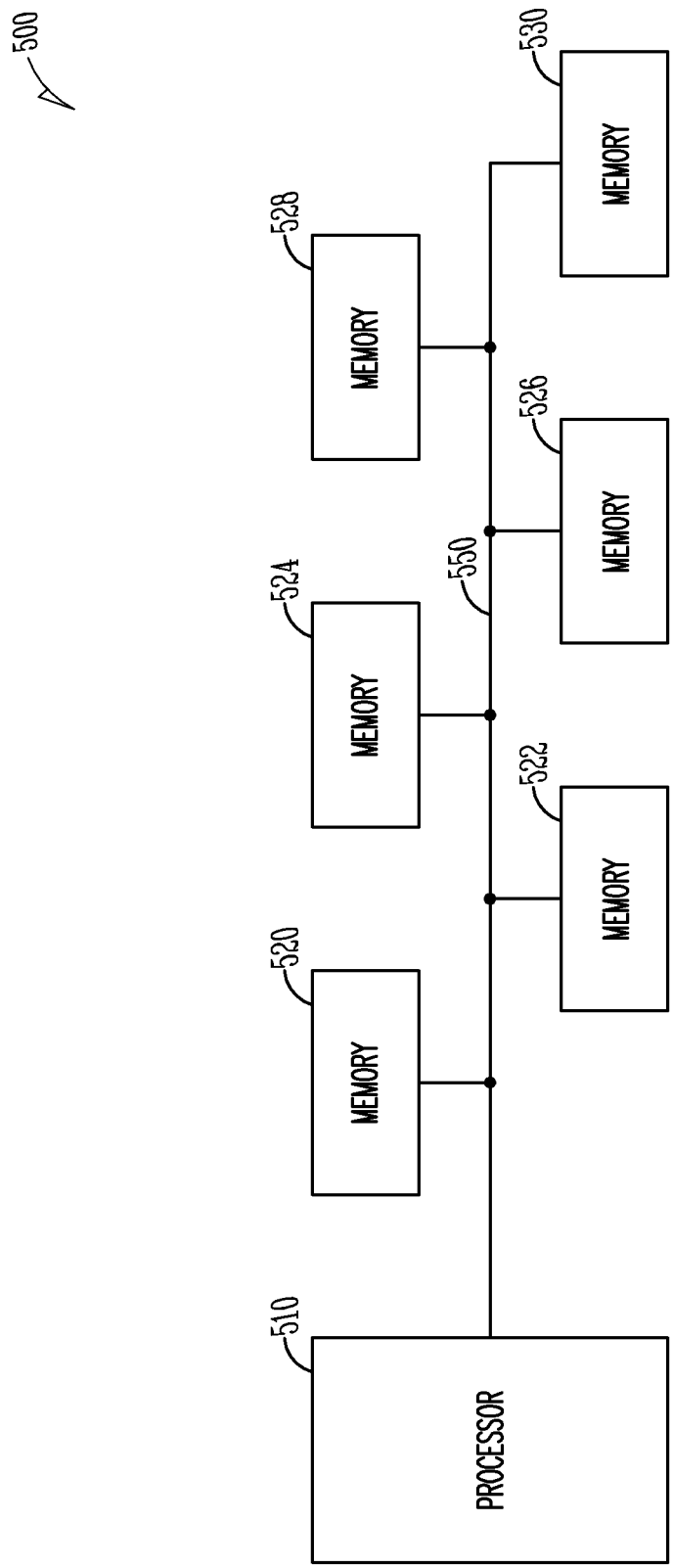
FIG. 5 is a block diagram of a system according to various embodiments of the invention.

The stack 120 shown and described herein with reference to FIG. 1 is a vertical stack in which IC dies are arranged in a substantially linear orientation. The individual IC dies in a stack may be arranged on a planar surface such as a circuit board as is shown in FIG. 5 and described below according to various embodiments of the invention. The individual IC dies in a stack may have any other order, arrangement, or orientation with respect to each other according to various embodiments.

FIG. 5 is a block diagram of a system 500 according to various embodiments of the invention. The system 500 includes a processor 510 coupled to multiple memory devices 520, 522, 524, 526, 528, and 530 through a bus 550. The processor 510, the memory devices 520-530, and the bus 550 may be arranged on a planar surface such as a circuit board. The various embodiments of the invention described herein may be implemented by the system 500.

Figure 6:
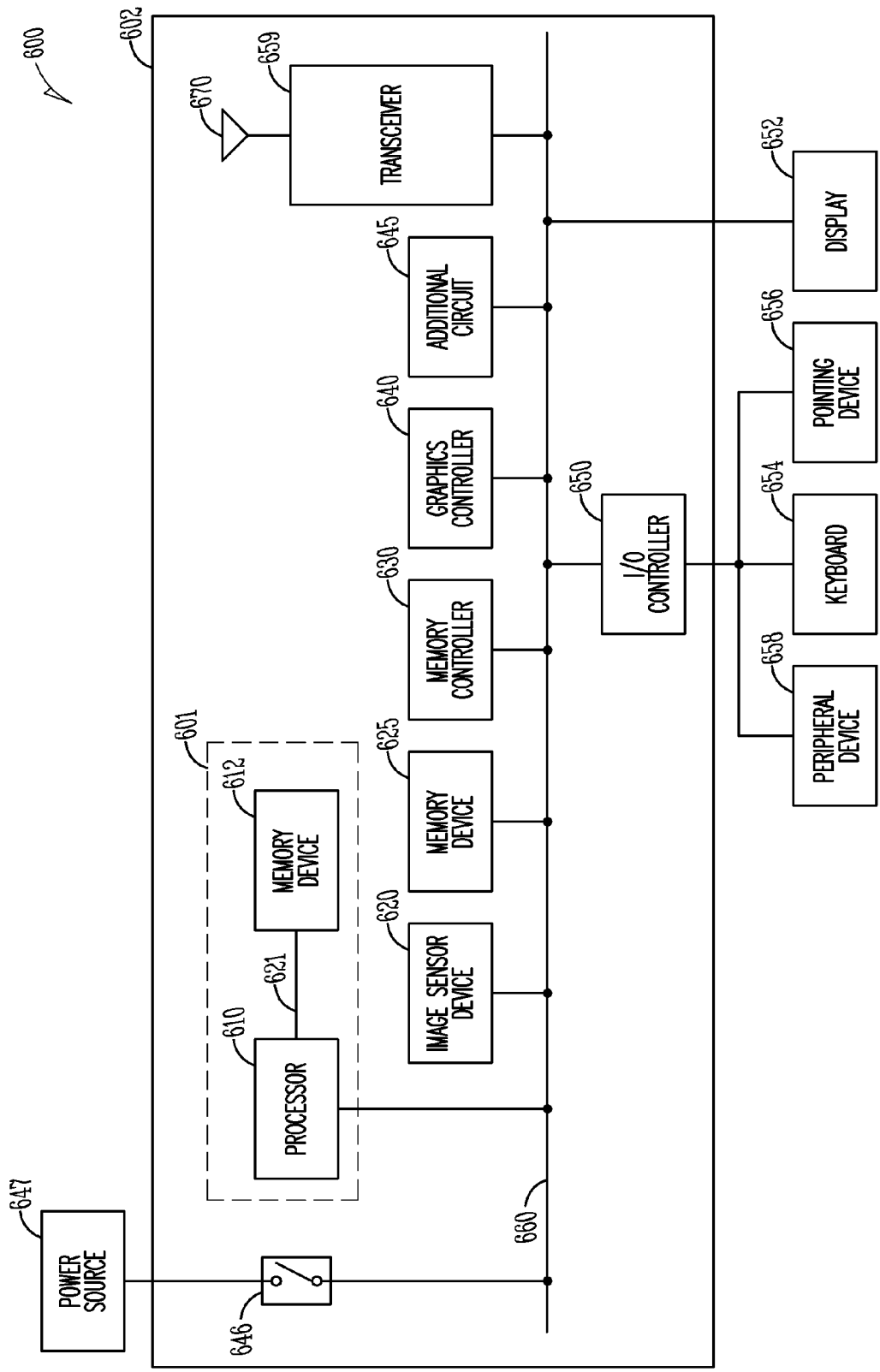
FIG. 6 is a block diagram of a system according to various embodiments of the invention.

FIG. 6 is a block diagram of a system 600 according to various embodiments of the invention. The system 600 may include a processor 610, a first memory device 612, an image sensor device 620, a second memory device 625, a memory controller 630, a graphics controller 640, an additional circuit 645, an input and output (I/O) controller 650, a display 652, a keyboard 654, a pointing device 656, a peripheral device 658, and a system transceiver 659. The system 600 may also include a bus 660 to transfer information among the components of the system 600 and to provide power to at least some of these components, a circuit board 602 where some of the components of the system 600 may be attached, and an antenna 670 to wirelessly transmit and receive information to and from the system 600. The transceiver 659 may operate to transfer information from one or more components of the system 600 such as the processor 610 or the memory device 625 to the antenna 670. The transceiver 659 may also operate to transfer information received at the antenna 670 to at least one of the processor 610 and the memory devices 625 and 612. Information received at the antenna 670 may be transmitted to the system 600 by a source external to the system 600.

One or more of the components of the system 600 may be operated according to the methods 300 or 400 shown and described with reference to FIG. 3 or FIG. 4.

The system 600 may also include a switch 646 such as a push button switch coupled to the bus 660 and a power source 647. The switch 646 may be engaged to couple power from the power source 647 to one or more of the components of system 600 such as the processor 610 or the memory device 612.

The processor 610 may include a general-purpose processor or an application specific IC (ASIC). The processor 610 may include a single core processor or a multiple-core processor. The processor 610 may execute one or more programming commands to process information. The information may include digital output information provided by other components of system 600 such as the image sensor device 620 or the memory device 625.

Each of the memory devices 625 and 612 may include a volatile memory device, a non-volatile memory device, or a combination of both. For example, the memory device 625 may comprise a DRAM device, a static random access memory (SRAM) device, a flash memory device, or a combination of these memory devices.

Each of the memory devices 625 and 612 and/or the processor 610 may be arranged in a stack of IC dies according to the various embodiments described herein, such as the stack 120 shown and described with reference to FIG. 1. Each of the memory devices 625 and 612 and/or the processor 610 may be operated according to the methods 300 or 400 shown and described with reference to FIG. 3 or FIG. 4.

Some components of the system 600 may be arranged together such that the system 600 may include a system in package (SIP). For example, the memory device 612 and the processor 610 may be a part of a SIP 601 or the entire SIP 601 in which the memory device 612 may be used as a cache memory for the processor 610. The memory device 612 may be a level L1 cache, a level L2 cache, a level L3 cache, or a combination thereof. The processor 610 and the memory device 612 may communicate with each other through one or more channels 621.

The image sensor device 620 may include a complementary metal-oxide-semiconductor (CMOS) image sensor having a CMOS pixel array or charge-coupled device (CCD) image sensor having a CCD pixel array. The display 652 may include an analog display or a digital display. The display 652 may receive information from other components. For example, the display 652 may receive and display information such as text or images that is processed by one or more of the image sensor device 620, the memory device 625, the graphics controller 640, and the processor 610.

The additional circuit 645 may include circuit components used in a vehicle (not shown). The additional circuit 645 may receive information from other components to activate one or more subsystems of the vehicle. For example, the additional circuit 645 may receive information that is processed by one or more of the image sensor device 620, the memory device 625, and the processor 610 to activate one or more of an air bag system, a vehicle security alarm, and an obstacle alert system.

The systems and methods presented herein may provide increased efficiency by increasing the amount of useful information contained in digits transmitted to multiple devices. This reduces the bandwidth used to transmit the information to multiple devices and may reduce the number of channels over which the information is transmitted. This can lead to a significant performance improvement.

Any of the circuits or systems described herein may be referred to as a module. A module may comprise a circuit and/or firmware according to various embodiments.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it can be seen that various features are arranged together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of one or more of the disclosed embodiments. Thus, the following claims are hereby incorporated into the Detailed Description, with each claim standing on its own as a separate embodiment.

What is claimed is:

1. A method comprising:
   checking first received data digits for error according to a first algorithm in a first integrated circuit (IC) device in a system with a plurality of IC devices including the first IC device and a second IC device;
   acting in response to the first received data digits in the first IC device when no error is detected in the first received data digits;
   checking second received data digits for error according to a second algorithm in the second IC device in the system, the second algorithm being different from the first algorithm; and
   acting in response to the second received data digits in the second IC device when no error is detected in the second received data digits.

2. The method of claim 1, further comprising sending an error message to an interface device if an error is detected in the first received data digits or the second received data digits.

3. The method of claim 1, wherein the first received data digits and the second received data digits are received from an interface device commonly coupled to at least some of the IC devices.

4. The method of claim 1, wherein checking the first received data digits for error includes checking the first received data digits for error according to a cyclic redundancy check (CRC) polynomial that is different for each of the first and the second IC devices.

5. The method of claim 1, wherein checking first received data digits for error includes checking the first received data digits for error according to an algorithm selected from the group consisting of a Hamming code, a Reed-Solomon code, a Bose Chaudhuri Hocquenghem (BCH) code, a binary Golay code, a ternary Golay code, a Reed-Muller code, a turbo code, and a low-density parity-check (LDPC) code.

6. A method comprising:
   receiving data digits and correction digits in each of a plurality of IC devices;
   encoding correction digits for the data digits according to an algorithm in each of the IC devices;
   modifying the encoded correction digits in a first manner in a first one of the IC devices to generate first modified correction digits;
   acting in response to the data digits in the first IC device when no error is detected in the data digits according to the first modified correction digits;
   modifying the encoded correction digits in a second manner in a second one of the IC devices to generate second modified correction digits; and
   acting in response to the data digits in the second IC device when no error is detected in the data digits according to the second modified correction digits.

7. The method of claim 6, wherein receiving the data digits further comprises receiving the data digits from an interface device coupled to all of the IC devices.

8. The method of claim 6, wherein:
   encoding the correction digits for the data digits according to an algorithm further comprises dividing the data digits by a cyclic redundancy check (CRC) polynomial to generate CRC digits in each of the IC devices; and
   receiving the data digits and correction digits further comprises receiving the data digits and the CRC digits in each of the IC devices.

9. The method of claim 6, further comprising:
   comparing the first modified correction digits with the received correction digits in the first IC device; and
   comparing the second modified correction digits with the received correction digits in the second IC device.

10. The method of claim 6, wherein:
    modifying the encoded correction digits in a first manner further comprises adding a first quantity to the encoded correction digits in the first IC device; and modifying the encoded correction digits in a second manner further comprises adding a second quantity to the encoded correction digits in the second IC device, the second quantity being different from the first quantity.

11. The method of claim 10, wherein the first quantity is a first integer, and the second quantity is a second integer.

12. A method comprising:
checking received data digits for error according to a first algorithm in a first IC device in a system with a plurality of IC devices including the first IC device;
acting in response to the received data digits in the first IC device when no error is detected in the received data digits according the first algorithm;
checking received data digits for error according to other algorithms associated with other IC devices in the system; and
sending an error message to an interface device coupled to all of the IC devices when an error is detected in the received data digits according to each of the first algorithm and the other algorithms.

13. The method of claim 12, wherein checking the received data digits for error according to a first algorithm includes:
dividing the received data digits by a first cyclic redundancy check (CRC) polynomial associated with the first IC device to generate a first remainder; and
comparing the first remainder with correction digits received with the data digits.

14. The method of claim 12, wherein checking the received data digits for error according to other algorithms includes:
dividing the received data digits by a other cyclic redundancy check (CRC) polynomials associated with the other IC devices in the system to generate other remainders; and
comparing the other remainders with correction digits received with the data digits.

15. The method of claim 12, wherein checking the received data digits for error according to a first algorithm includes:
calculating first error correcting code (ECC) digits for the received data digits according to a first algorithm associated with the first IC device; and
comparing the first ECC digits with correction digits received with the data digits.

16. The method of claim 12, wherein checking the received data digits for error according to other algorithms includes:
calculating other error correcting code (ECC) digits for the received data digits according to other algorithms associated with the other IC devices in the system; and
comparing the other ECC digits with correction digits received with the data digits.

17. A system comprising:
a plurality of integrated circuit (IC) devices, each IC device being structured to:
check received data digits for error according to an algorithm associated with the IC device, the algorithm being different for each IC device; and
act in response to the data digits when the data digits are received without an error being detected.

18. The system of claim 17, wherein each IC device is structured to:
check the received data digits for error according to algorithms associated with the other IC devices; and
send an error message to an interface device coupled to all of the IC devices if an error is detected in the received data digits according to each of the algorithms.

19. The system of claim 17, wherein each IC device is structured to:
generate correction bits for the received data digits; and
compare the generated correction bits to correction bits received with the received data digits.

20. The system of claim 17, wherein the IC devices are arranged on one or more planar surfaces and are coupled to an interface device through a bus.

21. The system of claim 17, wherein the IC devices are arranged in a stack with an interface device, a plurality of through silicon vias being coupled to the IC devices and the interface device to carry signals between the IC devices and the interface device.

22. The system of claim 17, wherein the IC devices comprise dynamic random access memory (DRAM) devices and/or processors.

23. An apparatus comprising:
an interface device coupled to a plurality of integrated circuit (IC) devices arranged in a stack with the interface device, the interface device being structured to:
generate correction digits for data digits according to an algorithm associated with a selected one of the IC devices; and
send the data digits with the correction digits to all of the IC devices.

24. The apparatus of claim 23, wherein the interface device is further structured to receive an error message from a first one of the IC devices if an error is detected in the data digits according to an algorithm associated with the first IC device.

25. The apparatus of claim 23, further comprising:
a plurality of through silicon vias coupled to the IC devices and the interface device to carry signals between the IC devices and the interface device; and
wherein:
the interface device is an IC; and
the interface device includes:
a control circuit to control information exchanged between a processor and the IC devices;
a write buffer circuit to store information to be transmitted to the IC devices;
a read buffer circuit to store information received from the IC devices; and
a sequencer circuit to control information exchanged between the interface device and the IC devices.

* * * * *

UNITED STATES PATENT AND TRADEMARK OFFICE
CERTIFICATE OF CORRECTION

| | |
|---|---|
| PATENT NO. | : 8,418,014 B2 |
| APPLICATION NO. | : 13/355197 |
| DATED | : April 9, 2013 |
| INVENTOR(S) | : Ebrahim H. Hargan |

It is certified that error appears in the above-identified patent and that said Letters Patent is hereby corrected as shown below:

In the Claims:

In column 9, line 13, in Claim 12, delete "according the" and insert -- according to the --, therefor.

In column 10, line 40, in Claim 25, delete "vias coupled" and insert -- vias being coupled --, therefor.

Signed and Sealed this
Eleventh Day of June, 2013

Teresa Stanek Rea
*Acting Director of the United States Patent and Trademark Office*